(12) United States Patent
Buynoski et al.

(10) Patent No.: US 6,403,492 B1
(45) Date of Patent: Jun. 11, 2002

(54) METHOD OF MANUFACTURING SEMICONDUCTOR DEVICES WITH TRENCH ISOLATION

(75) Inventors: Matthew S. Buynoski, Palo Alto; Darin A. Chan, Campbell, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/776,307

(22) Filed: Feb. 2, 2001

(51) Int. Cl.[7] ............................................. H01L 21/302
(52) U.S. Cl. ....................... 438/712; 438/723; 438/724; 438/756; 438/757
(58) Field of Search ................................. 438/692, 694, 438/657, 700, 710, 724, 723, 756, 757, 712

(56) References Cited

U.S. PATENT DOCUMENTS

| | | | |
|---|---|---|---|
| 5,433,794 A | 7/1995 | Fazan et al. | 148/33.3 |
| 5,777,370 A * | 7/1998 | Omid-Zohoor et al. | 257/374 |
| 5,895,254 A * | 4/1999 | Huang et al. | 438/424 |
| 5,930,644 A | 7/1999 | Tsai et al. | 438/424 |
| 5,930,645 A | 7/1999 | Lyons et al. | 438/424 |
| 5,970,362 A | 10/1999 | Lyons et al. | 438/424 |
| 5,970,363 A | 10/1999 | Kepler et al. | 438/435 |
| 6,051,480 A * | 4/2000 | Moore et al. | 438/435 |
| 6,069,058 A | 5/2000 | Hong | 438/436 |
| 6,074,927 A | 6/2000 | Kepler et al. | 438/400 |
| 6,090,712 A | 7/2000 | Lyons et al. | 438/691 |
| 6,287,939 B1 * | 9/2001 | Huang et al. | 438/435 |

* cited by examiner

Primary Examiner—Benjamin L. Utech
Assistant Examiner—Binh X. Tran
(74) Attorney, Agent, or Firm—Renner, Otto, Boisselle & Sklar, LLP

(57) ABSTRACT

A method of trench isolation includes removal of insulation material after planarization of the insulation material and before stripping of a nitride layer such as polish stop layer. The removal of insulation material may be accomplished, for example, by etching. The amount of material removed may be selected so that a surface of the device is substantially planar after one or more subsequent processing steps.

22 Claims, 4 Drawing Sheets

METHOD OF MANUFACTURING SEMICONDUCTOR DEVICES WITH TRENCH ISOLATION

CROSS REFERENCE TO RELATED APPLICATION

Reference is made to commonly-assigned, concurrent-filed application Ser. No. 09/773,231, entitled "Method of Manufacturing Semiconductor Devices with Trench Isolation", which is herein incorporated by reference in its entirety.

BACKGROUND OF THE INVENTION

1. Technical Field

The present invention relates to a method of manufacturing semiconductor devices which include trench isolation.

2. Description of the Related Art

Current demands for high density and performance associated with ultra large scale integration require submicron features of about 0.25 microns and under, increased transistor and circuit speeds, and improved reliability. Such demands for increased density, performance and reliability require formation of device features with high precision and uniformity.

Conventional semiconductor devices include a substrate and various electrically isolated regions, called active regions, in which individual circuit components are formed. The electrical isolation of these active regions is typically accomplished by thermal oxidation of the semiconductor substate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically includes source/drain regions formed in the semiconductor substrate by implantation of impurities, spaced apart by a channel region on which a gate electrode is formed with a gate oxide layer therebetween. The gate electrode controls the turn-on and turn-off of each transistor.

A typical method of trench formation includes initially growing a pad oxide layer on the substrate, and depositing a nitride polish stop layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material (or "trench fill"), such as silicon dioxide derived from tetraethyl orthosilicate (TEOS). The surface is then planarized, as by chemical-mechanical polishing (CMP) using the nitride layer as a polish stop, and the nitride and pad oxide are stripped off the active areas to complete the trench isolation structure.

One problem with prior trench isolation methods is that use of the polish stop and the pad oxide creates a topological step in the resulting device. Such a topological step may make it difficult, for example, to photolithographically process subsequent layers of the device with accuracy, particularly in forming submicron features, thereby adversely affecting process yield and production cost. In addition, such a topological step may adversely affect the uniformity of thickness of subsequently formed layers of material.

SUMMARY OF THE INVENTION

A method of trench isolation includes removal of insulation material after planarization of the insulation material and before stripping of a nitride layer such as polish stop layer. The removal of insulation material may be accomplished, for example, by etching. The amount of material removed may be selected so that a surface of the device is substantially planar after one or more subsequent processing steps.

According to an aspect of the invention, a method of trench isolation includes polishing deposited insulation material used to fill trenches, to the level of a polish stop, removing a further amount of the insulation material, and stripping the polish stop.

According to another aspect of the invention, a method of trench isolation includes multiple etchings of insulation material used to fill trenches, one of the etchings occuring before stripping an imbedded nitride element, and another of the etchings occuring after stripping of the nitride element.

According to yet another aspect of the invention, a method of trench isolation includes compensating for the height of polish step elements by removing insulation material below the level of a upper surface of the polish stop elements prior to removing the polish stop elements.

According to still another aspect of the invention, a method of forming a semiconductor device on a substrate includes the steps of: forming a pad oxide layer on the substrate; forming a polish stop layer on the pad oxide layer; selectively removing portions of the polish stop layer, the pad oxide layer, and underlying portions of the substrate, thereby forming trenches in the polish stop layer and leaving polish stop elements of the polish stop layer; depositing an insulating material to fill the trenches; planarizing the insulating material; performing a first etch of the insulating material; removing the polish stop elements; and performing a second etch of the insulating material.

According to a further aspect of the invention, a method of forming a semiconductor device with a planar surface includes the steps of: planarizing a surface of insulating trench fill material by removing insulating material until the trench fill material is substantially flush with top surfaces of polish stop elements within the insulating materials; performing a first etch of the trench fill material; removing the polish stop elements; and performing a second etch of the trench fill material.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A method of trench isolation includes removing of additional insulation material after polishing and before stripping of polish stop elements. The additional removal of insulation material may include etching of exposed surfaces of the insulation material. The removal of additional material results in a more planar topography after clean up processes following stripping of the polish stop elements, such as etching or other processes to uncover clean semiconductor material. The planar topography facilitates formation of flat, uniform-thickness layers in subsequent processing steps.

Figure 1:
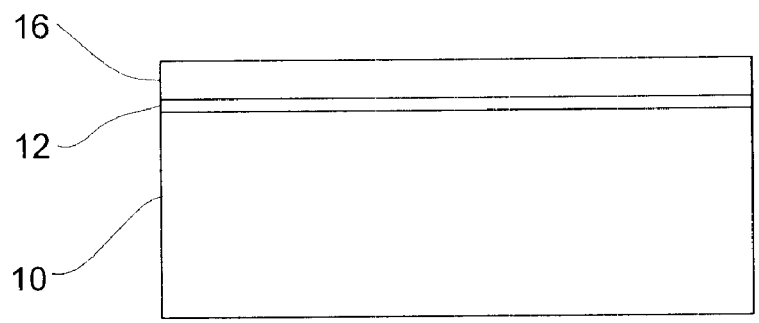
FIGS. 1–11 are cross-sectional views of various steps in a method of fabricating the semiconductor device in accordance with the present invention.

Initial steps of a example method in accordance with the present invention are illustrated in FIG. 1. A substrate 10 is prepared having a substantially planar surface. The substrate may be a semiconductor substrate including doped monocrystalline silicon or an epitaxial layer formed on a semiconductor substrate in accordance with conventional practices. The substrate 10 may be a pure semiconductor material or may be a semiconductor-on-insulator (SOI) material which includes a subsurface insulator layer. A pad oxide layer 12 is then grown on the substrate 10. The pad oxide layer 12 may include silicon oxide and may be thermally grown on the substrate 10 or may be deposited by chemical vapor deposition (CVD) to a suitable thickness; e.g., about 100 angstroms to about 200 angstroms. Alternatively, a pad oxide containing a thinned thermally-grown silicon oxide layer and a buffer polycrystalline silicon layer may be employed as the pad oxide layer 12. The pad oxide layer 12 functions as a buffer layer cushioning stresses between substrate 10 and subsequently applied layers. After formation of the pad oxide layer 12, a polish stop layer 16 is deposited on the pad oxide layer 12. The polish stop layer 16 may be a layer of silicon nitride formed by chemical vapor deposition on the pad oxide layer 12. An exemplary thickness for the polish stop layer 16 is between about 1500 angstroms and about 1800 angstroms.

Figure 2:
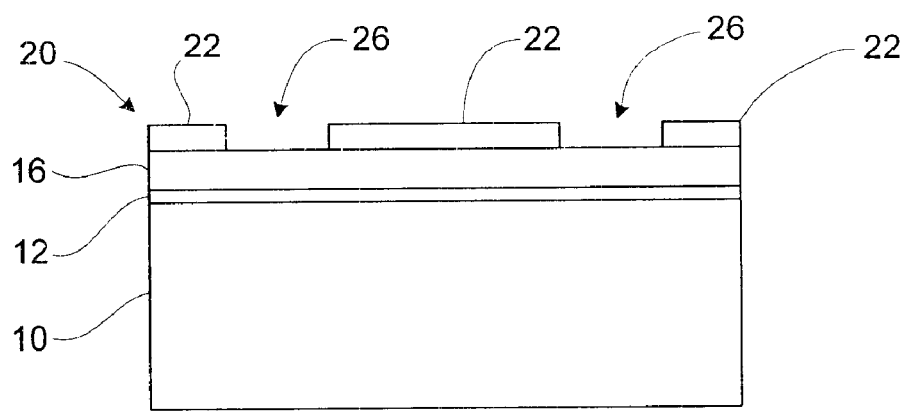

As shown in FIG. 2, a mask 20 is then formed on the polish stop layer 16. The mask 20 may formed by deposition of a resist such as photoresist, followed by selective exposure and etching of the resist to produce the mask of mask elements 22 with mask openings 26 therebetween.

Figure 3:
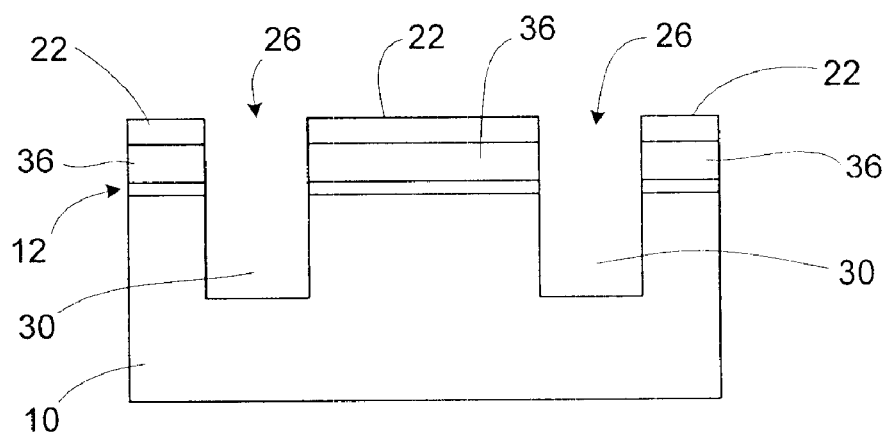
Figure 4:
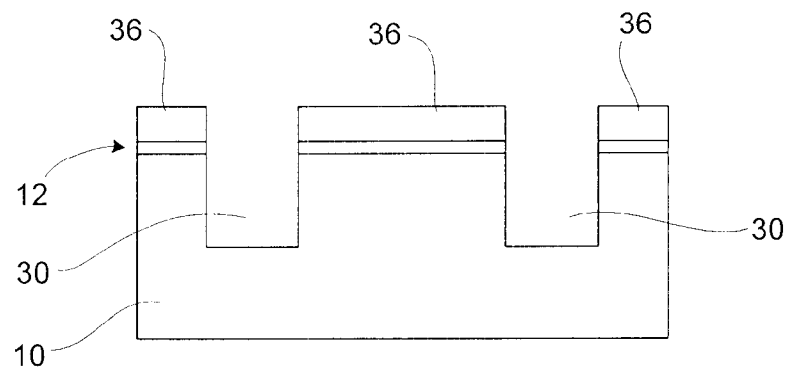

Turning now to FIG. 3, one or more etching steps are used to remove the parts of the polish stop layer 16 and the pad oxide layer 12 which are exposed by the mask openings 26, and to form trenches 30 in the underlying part of the substrate 10. The etching process for a silicon substrate is typically an anisotropic dry etch using hydrogen bromide (HBr) which has selectivity characteristics such that it etches the silicon substrate but not the silicon nitride mask. The trenches 30 may be etched to a depth of up to about 4000 angstroms, and may be etched to a depth of between about 2500 angstroms to about 3000 angstroms. The etching removes portions of the polish stop layer 16, leaving discrete polish stop elements 36. After the etching to form the trenches 30, the mask elements 22 are stripped off, thereby revealing the underlying polish stop elements 36, as illustrated in FIG. 4.

Figure 5:
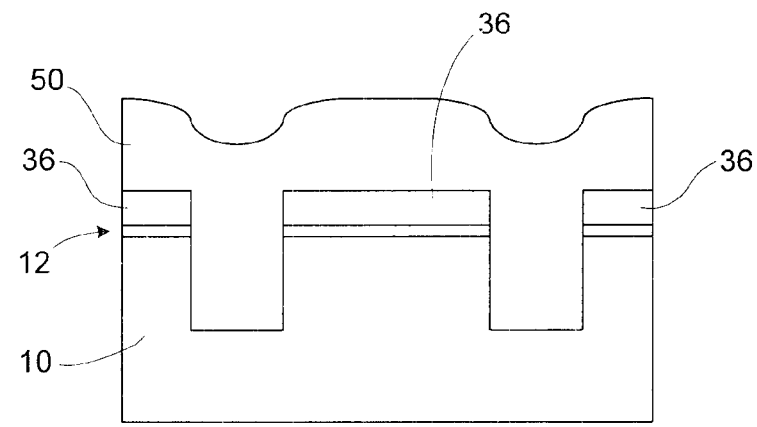

After the trenching, inner surfaces of the trenches 30 may be thermally oxidized to form an oxide liner in contact with the pad oxide layer 12. The thermal oxidation may occur at a temperature of at least about 1000 degrees C. Subsequently, the trenches 30 are filled with a suitable insulating material 50, as shown in FIG. 5. An example of the insulating material 50 is silicon dioxide, which may be derived from tetraethyl orthosilicate (TEOS) by low pressure chemical vapor deposition (LPCVD), or may be derived from silane by LPCVD. The thickness of the deposited insulating material 50 may be between about 5000 angstroms and about 8000 angstroms.

Figure 6:
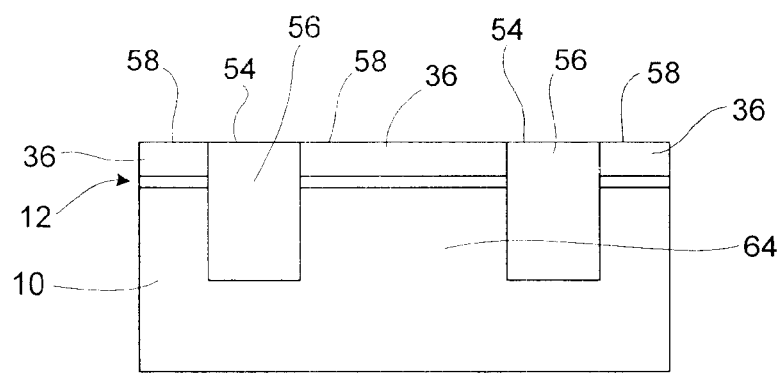

As shown in FIG. 6, the insulating material 50 is then planarized, for example by CMP, such that upper surfaces 54 of the resulting insulation trench fills 56 are substantially flush with upper surfaces 58 of the polish stop elements 36.

Figure 7:
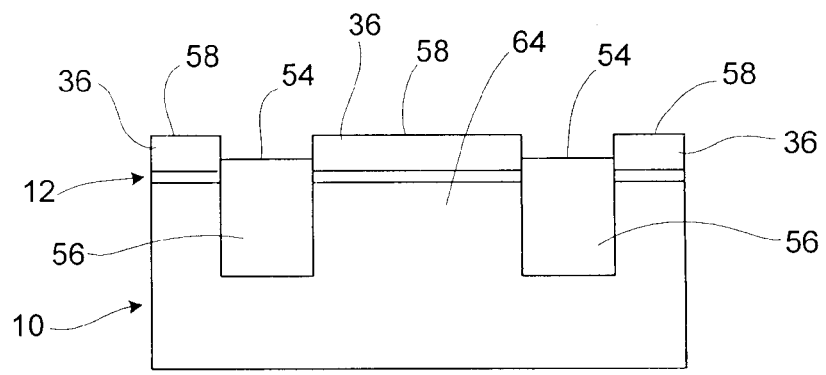

Referring to FIG. 7, then an additional removal of insulation material from the insulation fills 56 is performed, bringing the upper surfaces 54 of the insulation fills below the upper surfaces 58 of the polish stop elements. As described further below, the additional removal of material aids in planarizing an upper surface of the device in subsequent steps, which in turn facilitates formation of additional layers of material which are substantially planar and have substantially uniform thickness. The additional removal of insulation material may be accomplished by etching or other suitable means. The etching for the additional removal may be wet etching or dry etching, for example including plasma etching. An example of a suitable wet etchant for etching silicon nitride is potassium hydroxide. Dry etching processes may include ion bombardment or reactive ion plasma etching. An example of an etching material for plasma etching of silicon nitride is $CHF_3$.

The amount of additional insulation material removed may be controlled, for example, by controlling the length of time of the etch. The depth of additional material removed may be for instance from about 300 angstroms to about 700 angstroms. The amount of material removed may be selected such that the top surface of the device is substantially planar after the clean-up processes described below in connection with FIG. 9. For instance, the amount of material removed may be selected so that the top surface of the device is planar to within 200 Angstroms after the clean-up processes described below in connection with FIG. 9. Alternatively, the amount of material removed may be selected so that the top surface of the device is planar to within 100 Angstroms after the clean-up processes described below in connection with FIG. 9. From another perspective, the amount of material removed may be selected such that the upper surfaces 54 of the insulation fills 56 are slightly above (have a positive step relative to) the adjacent active region 64 of the substrate 10. The height of the positive step may less than 200 Angstroms, and may be less then 100 Angstroms. A feedback arrangement, for example using in-line metrology, may be utilized to provide enhanced control of the amount of material removed.

Figure 8:
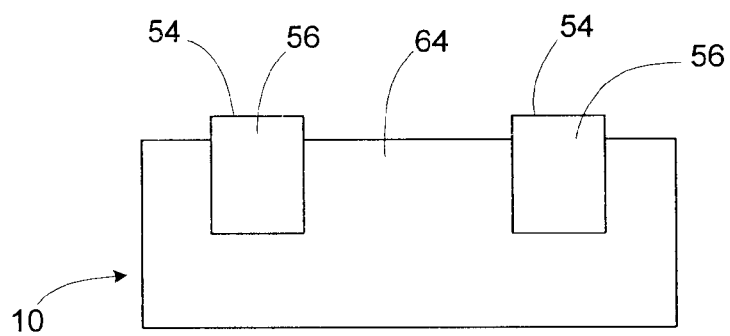

The polish stop elements 36 are then stripped off, as shown in FIG. 8. Stripping of the polish stop elements may be accomplished for example by a wet etch using a hot phosphoric acid solution. In addition, it will be appreciated that some or all of the pad oxide layer 12 may be removed, for example by a hydrofluoric acid dip.

Figure 9:
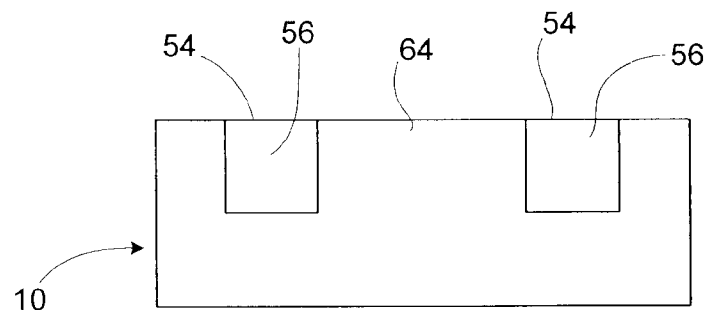

FIG. 9 illustrates "clean-up" processes which may then be performed to prepare the surface for formation of a gate on the active region 64. The clean-up processes may involve one or more etches, for example to uncover a "clean" semiconductor surface for subsequent oxide formation, or to remove any already-present surface oxide, in order to control oxide thickness for the gate dielectric.

Figure 10:
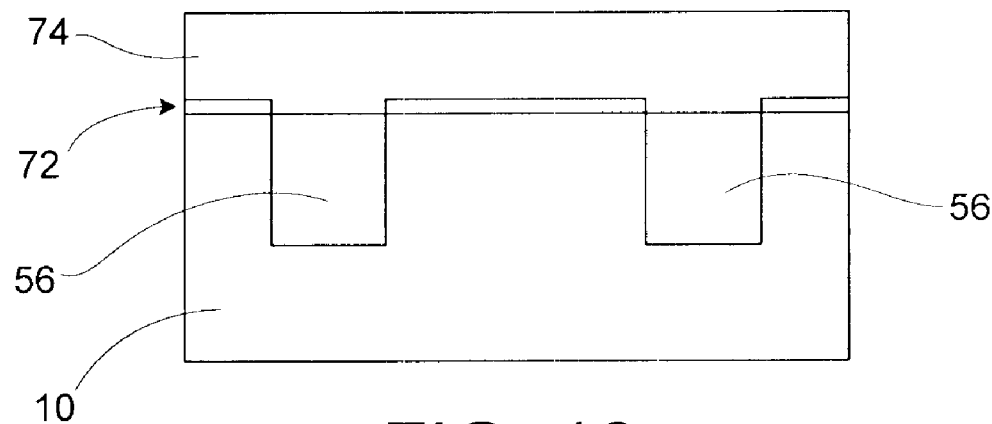
Figure 11:
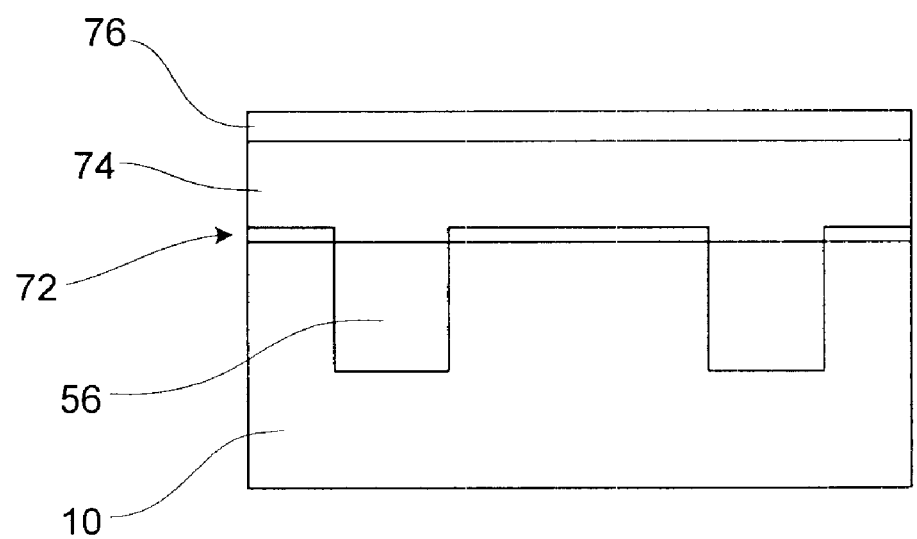

FIGS. 10 and 11 illustrate subsequent processing steps used in formation of a gate on the active region 64. FIG. 10 shows the formation of a gate oxide layer 72, and deposition thereupon of a layer 74 of semiconductor material, for example polysilicon. FIG. 11 illustrates formation of an semiconductor-metal compound layer 76, for example a silicide, on the semiconductor material layer 74. Silicidation may be accomplished by depositing a layer of metal on the semiconductor material layer 74. The deposited metal may be a metal such as titanium, cobalt, or nickel, which is suitable for forming a conducting compound, such as a silicide, with the semiconductor material. The metal layer may be deposited, for example, by sputtering. Then a compound such as a silicide is formed between the metal of the metal layer and the semiconductor material. Suitable methods for formation of such electrically-conducting compounds (e.g., silicidation) are well known, an exemplary method being raising the temperature of the device to a suitable level for a suitable length of time (annealing). An exemplary temperature is between about 500 and 700° C., and an exemplary suitable length of time is between 10 seconds and 10 minutes. Rapid thermal annealing (RTA) may also be employed, for example subjecting the device to a temperature between 600 and 900° C. for about 5 to 120 seconds. It will be appreciated that other temperatures and heating times may be employed. Finally, excess metal may be removed by conventional, well-known means.

It will be appreciated that many other further processing steps may alternatively or additionally be performed.

It will also be appreciated that the above-described method is only exemplary, and that many suitable variations may be employed. For example, it may be possible that some of the above-described method steps may be performed in a different order, with suitable modification. It will be appreciated that suitable substitutions of material may be possible, for example possibly substituting oxides for nitrides and vice versa.

Further, it will be appreciated that the method described above may be combined with features of other trench isolation methods. For instance, the method described above may be combined with features of a method of avoiding "stringers" of material between the active region and adjacent trench fills, the method including removal of side portions of polish stop elements. Such a method is described in commonly-assigned, concurrently-filed application Ser. No. 09/773,231, entitled "Method of Manufacturing Semiconductor Devices with Trench isolation", which is incorporated by reference in its entirety.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming a semiconductor device on a substrate, the method comprising:

forming a pad oxide layer on the substrate;

forming a polish stop layer on the pad oxide layer;

selectively removing portions of the polish stop layer, the pad oxide layer, and underlying portions of the substrate, thereby forming trenches in the polish stop layer and leaving polish stop elements of the polish stop layer;

depositing an insulating material to fill the trenches;

planarizing the insulating material;

following the planarizing, performing a first etch of the insulating material;

following the performing the first etch, removing the polish stop elements; and following the removing the polish stop elements, performing a second etch of the insulating material.

2. The method of claim 1, wherein the planarizing the insulating material includes making an upper surface of the insulating material substantially flush with top surfaces of the polish stop elements.

3. The method of claim 1, wherein the performing the first etch includes etching exposed insulating material to a depth of between 300 and 700 angstroms.

4. The method of claim 1, wherein the first etching includes plasma etching.

5. The method of claim 1, wherein the first etching includes dry etching.

6. The method of claim 1, wherein the first etching includes wet etching.

7. The method of claim 1, wherein the selectively removing includes:

forming a mask over a portion of the polish stop layer;

etching to remove the portions of the polish stop layer and the pad oxide layer which are not covered by the mask, and to form the trenches; and removing the mask.

8. The method of claim 1, wherein the substrate is a semiconductor wafer.

9. The method of claim 1, wherein the substrate is a semiconductor-on-insulator wafer.

10. The method of claim 1, wherein the performing the first etch includes etching such that at the conclusion of the first etch 1) a top surface of the trench fill material is below a top surface of the polish stop elements; and 2) the top surface of the trench fill material is above the pad oxide layer.

11. The method of claim 1, wherein, following the second etching, a top surface of the insulating material is substantially level with a top surface of untrenched areas of the substrate.

12. The method of claim 11, further comprising:

depositing additional semiconductor material on the top surfaces of the semiconductor material and the untrenched areas of the substrate; and forming a suicide on a top surface of the additional semiconductor material.

13. The method of claim 12, wherein the depositing produces a substantially planar top surface.

14. The method of claim 12, wherein the silicide has a substantially uniform depth.

15. A method of forming a semiconductor device with a planar surface, comprising:

planarizing a surface of insulating trench fill material by removing insulating material until the trench fill material is substantially flush with top surfaces of polish stop elements within the insulating materials;

following the planarizing, performing a first etch of the trench fill material;

following the performing the first etch, removing the polish stop elements; and following the removing the polish stop elements, performing a second etch of the trench fill material.

16. The method of claim 15, wherein the performing the first etch includes etching along an exposed surface of the trench fill material to a depth of between 300 and 700 angstroms.

17. The method of claim 15, wherein the first etching includes plasma etching.

18. The method of claim 15, wherein the first etching includes dry etching.

19. The method of claim 15, wherein the first etching includes wet etching.

20. The method of claim 15, wherein, following the second etching, an upper surface of the trench fill material is substantially level with a top surface of untrenched areas of the substrate.

21. The method of claim 15, wherein the removing the polish stop elements includes etching the polish stop elements.

22. The method of claim 15, wherein the performing the first etch includes etching such that at the conclusion of the first etch a top surface of the trench fill material is below a top surface of the polish stop elements.

* * * * *

UNITED STATES PATENT AND TRADEMARK OFFICE
CERTIFICATE OF CORRECTION

PATENT NO. : 6,403,492 B1
DATED : June 11, 2002
INVENTOR(S) : Buynoski et al.

It is certified that error appears in the above-identified patent and that said Letters Patent is hereby corrected as shown below:

Column 1,
Line 31, replace "substate" with -- substrate --

Signed and Sealed this

Sixth Day of August, 2002

Attest:

JAMES E. ROGAN
Attesting Officer  Director of the United States Patent and Trademark Office